(12) United States Patent
Cheng et al.

(10) Patent No.: US 7,296,532 B2
(45) Date of Patent: Nov. 20, 2007

(54) BYPASS GAS FEED SYSTEM AND METHOD TO IMPROVE REACTANT GAS FLOW AND FILM DEPOSITION

(75) Inventors: Yi-Lung Cheng, Taipei (TW); Mo-Chen Liao, Yunlin (TW); Eric Tsai, Yunlin (TW); Sze-Au Wu, Yunlin (TW); Ying-Lung Wang, Tai-Chung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1022 days.

(21) Appl. No.: 10/323,950

(22) Filed: Dec. 18, 2002

(65) Prior Publication Data

US 2004/0118342 A1 Jun. 24, 2004

(51) Int. Cl.
*C23C 16/00* (2006.01)

(52) U.S. Cl. .................. 118/723 MP; 118/723 VE; 438/706; 438/714; 156/345.29

(58) Field of Classification Search ............ 438/680, 438/681, 706, 710; 427/524, 534, 535; 118/697, 118/698, 723, 7

See application file for complete search history.

(56) References Cited

U.S. PATENT DOCUMENTS 6,217,658 B1 * 4/2001 Orczyk et al. ............ 118/697
6,268,288 B1 * 7/2001 Hautala et al. ............ 438/680

* cited by examiner

*Primary Examiner*—Lan Vinh
(74) *Attorney, Agent, or Firm*—Tung & Associates

(57) ABSTRACT

A method and reactant gas bypass system for carrying out a plasma enhanced chemical vapor deposition (PECVD) process with improved gas flow stability to avoid unionized reactant precursors and thickness non-uniformities the method including providing a semiconductor process wafer having a process surface within a plasma reactor chamber for carrying out at least one plasma process; supplying at least one reactant gas flow at a selected flow rate to bypass the plasma reactor chamber for a period of time to achieve a pre-determined flow rate stability; and, redirecting the at least one reactant gas flow into the plasma reactor chamber to carry out the at least one plasma process.

19 Claims, 2 Drawing Sheets

BYPASS GAS FEED SYSTEM AND METHOD TO IMPROVE REACTANT GAS FLOW AND FILM DEPOSITION

FIELD OF THE INVENTION

This invention generally relates to a gas feed system and method for a plasma enhanced chemical vapor deposition (PECVD) apparatus and method and more particularly to a gas feed system to improve gas flow characteristics during PECVD deposition to improve film deposition by avoiding reactions of unionized reactants and thickness non-uniformities.

BACKGROUND OF THE INVENTION

While there are many methods for depositing material in VLSI and ULSI technology, these methods maybe broadly classified into chemical vapor deposition (CVD) and physical vapor deposition (PVD). CVD is defined as the formation of a nonvolatile solid film on a substrate by the reaction of vapor phase reactants that contain the required chemical constituents of the solid film. The most common CVD deposition methods are atmospheric pressure CVD (APCVD), low pressure CVD (LPCVD), and plasma enhanced CVD (PECVD). PECVD is a preferred method where lower temperatures are required.

The CVD process includes, among other reaction steps, transport of the reactants to the surface of the substrate and reaction at the substrate surface. Depending on process parameters such as temperature and pressure, the deposition rate is primarily affected by parameters that affect the slowest reaction step and is frequently classified as either reaction limited or mass transport limited. However, even if the deposition rate is reaction limited, the surface reaction rate is affected by local non uniformities in gas phase reactant concentrations resulting in depletion non-uniformities and consequently film non-uniformities. On the other hand, if the deposition rate is mass-transport limited, it is crucial that the flux of gas phase reactant to the surface is uniform across the deposition substrate, for example, a semiconductor wafer. Thus, in either case uniformity in gas phase concentrations over the deposition substrate affects film uniformity.

For example, PECVD uses RF power to generate a glow discharge (plasma) thereby ionizing reactant precursors and imparting energy to the reactants allowing the deposition to occur at a lower temperature compared to APCVD or LPCVD depositions. As a result, PECVD depositions are generally reaction limited. Generally, free electrons are generated under the influence of RF energy and are accelerated by an electric field to collide with gas phase molecules thereby creating ions which may in turn be accelerated toward the substrate where they adsorb and rearrange to form a deposited solid film.

As feature geometries shrink, uniform CVD film deposition with fully reacted precursors is increasingly important and more difficult to achieve. In addition, as wafer sizes increase, etch/deposition uniformity has become increasingly harder to achieve in plasma reactors, for example, PECVD or HDP-CVD reactors. Nonuniformity in etching and deposition is typically exhibited across the diameter of process wafer with the greatest differences at the center and at the edges (circumference) of the process wafer. Consequently, semiconductor features exhibit asymmetric dimensions caused by etching or deposition non-uniformities.

Another problem in PECVD depositions is the reaction of incompletely ionized precursor reactants with certain portions of the wafer process surface, thus causing to formation of undesired film products at the surface which adversely affects the mechanical integrity and/or the electrical performance of the device.

According to the prior art, efforts to address deposition uniformity have focused on adjusting the power level of the RF power antenna (excitation source), for example, in an inductively coupled plasma source, a single or dual TCP (transformer coupled plasma), typically disposed outside the reactor chamber adjacent to a dielectric window through which power is transmitted to the reactor gases. In addition, efforts have been made to gain better control of the substrate temperature, for example, by including a dual temperature control on the electrostatic chuck (ESC) that holds the substrate.

It has also been found that the gas transport characteristics within a plasma reactor are a sensitive variable contributing to deposition non-uniformities. Although there have been a variety of gas feed systems proposed for plasma reactors, many of them have unacceptable shortcomings. While, prior art systems are generally effective in delivering, all of these systems exhibit the shortcoming of susceptibility to transient gas flow disruptions caused by a time lag for a flow controller, for example a mass flow controller to adjust to the proper flow delivery rate upon a change in flow delivery rates or precursors. As a result, gas flow transients can cause unacceptable non-uniformities or undesired reactant products at the film surface.

For example, gas feed systems for plasma reactors have included top gas feed arrangement where the gas feed is fed from the top of the reactor chamber toward the substrate surface. Further, arrangements have included, for example, gas feeds centrally located at the top of the chamber including shower head feed arrangements. Further, the prior art has disclosed gas feeds that are centrally located in the upper chamber including one or more gas feeds and which can be directed at a variety of angles generally toward the substrate surface. The gas feeds including the gas feed orifices are typically fine tuned for a particular deposition process creating complex patterns of interfering streams of gas to achieve fully ionized precursors with acceptable uniformity at the wafer process surface. The prior art gas feed systems cannot adequately adjust for transient gas flow disruptions, leading to undesired film non-uniformities and reaction products at the wafer process surface which increasingly adversely affects device performance as critical dimensions are reduced.

There is therefore a need in the semiconductor processing art to develop a gas feed system and method whereby gas transport conditions for a plasma enhanced CVD or etching process may be readily optimized while avoiding precursor gas flow transients.

It is therefore an object of the invention to provide a gas feed system and method whereby gas transport conditions for a plasma enhanced CVD or etching process may be readily optimized while avoiding precursor gas flow transients in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method and reactant gas bypass system for carrying out a plasma enhanced chemical vapor deposition (PECVD) process with improved gas flow stability to avoid unionized reactant precursors and thickness non-uniformities.

In a first embodiment, the method includes providing a semiconductor process wafer having a process surface within a plasma reactor chamber for carrying out at least one plasma process; supplying at least one reactant gas flow at a selected flow rate to bypass the plasma reactor chamber for a period of time to achieve a pre-determined flow rate stability; and, redirecting the at least one reactant gas flow into the plasma reactor chamber to carry out the at least one plasma process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the apparatus and method of the present invention is explained with reference to a particular plasma reactor configuration, it will be appreciated that the reactant gas bypass system of the present invention may be used with any plasma reactor system for plasma enhanced chemical vapor deposition (PECVD). In addition, although the method of the present invention is explained with reference to an exemplary implementation of forming a silicon nitride layer over exposed copper containing semiconductor features it will be appreciated that the method of the present invention using the reactant gas bypass system of the present invention may be used in any PECVD process where a stable gas flow including a plasma may be advantageously maintained to prevent undesired reactant deposition and deposition film thickness non-uniformities during the deposition process.

Figure 1A:
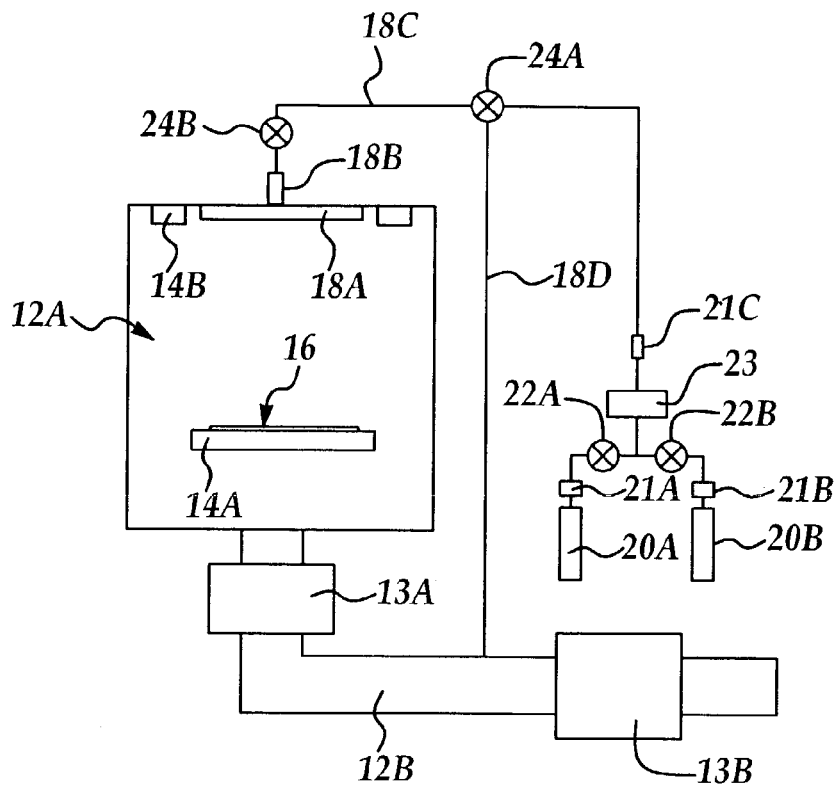
FIGS. 1A and 1B are schematic representations of a portion of a plasma reactor including a portion of a gas feed system including a bypass gas feed system portion according to embodiments of the present invention.

Referring to FIG. 1A, a portion of a reactant gas bypass system is shown together with an exemplary plasma reactor for example, including a plasma reactor chamber 12A. The plasma reactor includes at least one exhaust line e.g., 12B, including, for example a first pumping means, 13A, for example, a turbomolecular pump, optionally followed by a second pumping means 13B, for example a roughing pump to control the ambient pressure within the plasma reactor chamber 12A. Preferably, the plasma reactor includes one or more RF power sources to ignite and maintain a plasma within the plasma reactor chamber 12A. The plasma reactor chamber 12A, for example, may be part of a PECVD system or an HDPCVD system. The plasma reactor is preferably equipped for both etching and CVD although it may be equipped for primarily etching or primarily CVD operations. A substrate (wafer) support 14A is disposed within the plasma reactor chamber 12A, for example, centrally located at the bottom portion of the plasma reactor chamber for holding substrate (process wafer) 16, e.g., a process wafer, for example an electrostatic chuck including a resistive heating means for heating the process wafer and providing an optional RF electrode surface for biasing the process wafer. For example, the plasma reactor may include a gas distribution manifold 18A, disposed in an upper portion of the plasma reactor chamber 12A. A power RF electrode e.g., 14B, for example, is provided surrounding the gas distribution manifold 18A at the upper portion of the plasma reactor chamber 12A. RF electrodes 14A and 14B are preferably in electrical communication with an RF matching network and RF generator (not shown) as is known in the art.

Still referring to FIG. 1A, preferably, at least one gas inlet e.g., 18B is in gaseous flow communication with the gas distribution manifold 18A. For example, gas feed line 18C carries reactant gases provided from at least one reactant gas source e.g., 20A and 20B through respective gas flow rate control means, for example mass flow controllers 21A and 21B and through respective gas flow control valves e.g., 22A and 22B in, for example, a selectively open state of one of an open and closed state, to optional gas mixer 23 disposed in gas feed line pathway 18C. Upstream of optional gas mixer 23 in gas feed line 18C pathway is another gas flow rate control means 21C, preferably a mass flow controller (MFC), and including at least one gas flow control valve e.g., 24A, disposed between the MFC 21C and the gas inlet 18B, capable of redirecting a gas flow from gas feed line 18C to bypass gas line 18D as well as shutting off gas flow (three-way gas valve). More preferably, at least two gas flow control valves, e.g., 24A and 24B are disposed between the MFC 21C and the gas inlet 18B, the gas flow valve 24B capable of at least an open and closed state. For example, it has been found that one valve may be insufficient to prevent a measurable leakage of precursor reactant through the gas feed line 18C upon shutting off gas flow or bypassing gas flow, when only one gas control valve, e.g., 24A according to the present invention is included, leading to contamination of the process wafer.

Preferably, the MFC's, 21A, 21B, and 21C and gas flow control valves, e.g., 22A, 22B, 24A and 24B are in electrical communication with a controller having an operator interface (not shown) for interactively controlling and pre-programming flow rate parameters and gas control valve states for a plasma enhanced process, for example, a PECVD process. Preferably, the controller is able to set pre-determined flow rate parameters and operate the gas flow control valves in response to operating signals from the MFC's and/or according to pre-determined time periods.

According to one aspect of the present invention, a bypass gas flow line (pathway) 18D is provided between gas flow valves 24A and 24B in gaseous communication with gas feed line 18C including a gas flow directing means, e.g., gas control valve 24A to selectively switch (redirect) a gas flow from gas feed line 18C to a bypass gas flow line e.g., 18D. It will be appreciated that an additional gas flow control valve capable of an open and closed state may be added in gas bypass line 18D for selectively redirecting a gas flow. Bypass gas flow line 18D provides a reactant gas bypass flow pathway to bypass the plasma reactor chamber 12A, for example preferably communicating with exhaust line 12B or a separately supplied exhaust line for removing the bypass gas flow. It will be appreciated that several alternative plumbing arrangements may be made, but preferably, the bypass gas flow line 18D communicates with the exhaust line 12B downstream of a first pumping means e.g., 13A, and upstream of a second pumping means. e.g., 13B, for example between a turbomolecular and mechanical roughing pump, such that backflow of the bypass gas flow into the plasma reactor chamber 12A is avoided. It will be appreciated that a separate exhaust (vacuum) line may be optionally provided equipped with a separate pumping means to exhaust the bypass gas flow from bypass gas flow line 18D to avoid backflow of the bypass gas exhaust into the plasma reactor chamber 12A.

According to the present invention, in operation, a reactant gas flow is provided to bypass the plasma reactor chamber 12A along bypass line 18D at a flow rate near plasma process operating gas flow conditions for a pre-determined period of time or until a pre-determined flow rate stability of the desired gas flow rate through the MFC 21C is obtained. Preferably, the reactant gas flow rate is provided within about 10 percent of a subsequent plasma process starting gas flow rate. For example, to begin bypass operation, at least one of gas flow valves 22A and 22B are opened together with gas flow valve 24A redirecting gas flow along bypass gas flow pathway 18D. Preferably, gas flow control valve 24B is closed to prevent residual leakage into the plasma reactor chamber. For example, a gas flow from gas reactant sources e.g., 20A and 20B is pre-programmed through means of a controller to flow at a pre-determined flow rate through MFC's 21A, 21B, and 21C for either a pre-determined period of time or until a signal from at least MFC 21C indicates a flow rate within a pre-determined gas flow rate variation window for a pre-determined period of time. Upon expiration of the pre-determined period of time or upon operating within a gas flow rate variation window for a pre-determined period of time, the gas flow valve 24A is switched to redirect the gas flow along gas line 18C through gas control valve 24B into the plasma reactor chamber 12A. Preferably, the gas flow valve 24B is opened prior to redirecting gas flow valve 24A for gas flow along gas line 18C to prevent a pressure buildup which may lead to undesirable transients or surges of gas flow above desired gas flow rate levels. The gas flow valves e.g., 22A, 22B, 24A, and 24B are preferably in electrical communication with a controller for automated timed selection of gas flow pathways to avoid pressure buildup and consequent transient surges due to gas flow control valve switching.

Figure 1B:
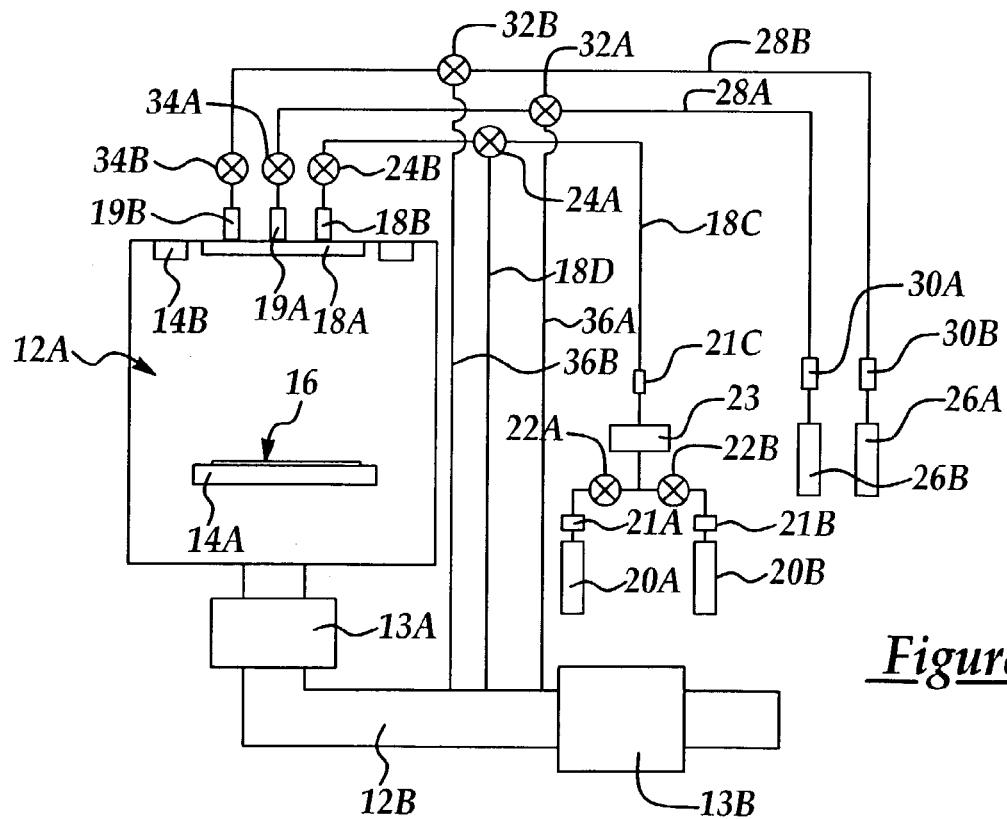

Referring to FIG. 1B, in another embodiment, a plurality of gas sources, for example, additionally including gas sources 26A and 26B are provided for feeding gas reactants to plasma reactor chamber 12A, for example through respective gas inlets 19A and 19B along separate gas feed lines 28A and 28B including through separate mass flow controllers (MFC) 30A and 30B. At least one gas flow control (directing) valve, e.g., 32A and 32B, are provided between each of the respective MFC's 30A and 30B and the respective gas inlets 19A and 19B. More preferably, a second gas flow valve e.g., 34A and 34B are provided upstream of the respective gas flow valves 32A and 32B to prevent undesired leakage or transient gas flow into the plasma reactor chamber 12A. It will be appreciated that the gas flow may optionally be directed into a single gas inlet e.g., 18B for each of the respective gas feed lines 18C, 28A, and 28B. In addition, it will be appreciated that one or more of gas inlets 18B, 19A and 19B may be provided in different areas of the reactor, for example, including a top, side, and bottom feed arrangement. For example, a gas reactant may be fed through a bottom feed arrangement including a gas distributor disposed below and surrounding the wafer holder 14A to provide an upward reactant gas flow.

In this embodiment, gas flow valves 24A, 32A, and 32B are shown as three-way switchable (redirecting) gas flow valves to provide a switchable (redirectable) gas flow pathway between the respective gas feed lines 18C, 28A, and 28B and respective bypass gas flow lines 18D, 36A and 36B including a closed state. It will be appreciated that two gas control valves including an open and closed state may be substituted for the three-way switchable gas control valves to achieve the same function, for example an open/closed gas control valve disposed in the bypass gas feed line in addition to an upstream open/closed gas control valve in the respective gas feed line. In exemplary operation, gas flow from at least one of the gas reactant feed lines 18C, 28A, and 28B is pre-programmed through a controller in electrical communication with the respective MFC's and gas flow control valves to initiate gas flow through the respective MFC's 21C, 30A and 30B to flow through respective bypass gas flow lines (pathways) 18D, 36A, and 36B for either a pre-determined period of time or until a predetermined flow rate stability in bypass flow is indicated by a signal from the respective MFC's. By the term flow rate stability is meant a predetermined variability in flow rate over time. Upon expiration of the pre-determined period of time or upon achieving a pre-determined flow rate stability, one or more of the respective bypass gas flows through lines 18D, 36A, and 36B are switched (redirected) by switching gas flow pathways in by means of respective gas flow control valves 24A, 32A, and 32B to flow through respective gas flow control valves 24B, 34A, and 34B into the plasma reactor chamber 12A by controllably and selectively switching one or more of the respective gas flow control valves and opening a respective second gas flow control valves e.g., 24B, 34A, and 34B to provide a gas flow pathway into the plasma reactor chamber 12A to avoid gas flow transient surges.

In exemplary implementation of the present invention, a semiconductor process wafer including exposed copper containing features, for example copper filled damascene structures formed in a dielectric insulating layer is provided within the plasma reactor chamber including, for example, a bypass gas flow system shown in FIG. 1B for carrying out a PECVD deposition process of an overlying layer of silicon nitride (e.g., $Si_3N_4$).

In a first step according to the exemplary implementation, the process wafer including exposed copper surfaces is pre-heated to a temperature of about 200° C. to about 350° C. In a second step, at least one source of $N_2$ gas is supplied to have a total $N_2$ gas flow rate of about 2200 scam to about 2700 scam to stabilize an operating pressure of about 2.5 Torr to about 4.2 Torr. In a third step, $NH_3$ gas is supplied at a flow rate of about 20 scam to about 40 scam to the plasma reactor to carry out a sputter plasma treatment to remove copper oxides (e.g., $CuO$, $Cu_2O$) from the surface of the exposed copper. At about the same time the $NH_3$ is supplied, or during the sputter plasma treatment, silane gas ($SiH_4$) is supplied in bypass flow (bypassing the plasma reactor chamber) at a flow rate about equal (with about 10 percent) to a subsequent CVD deposition flow rate of about 20 scam to about 85 sccm. It will be appreciated that the bypass gas flow may be supplied at a slightly higher or slightly lower flow rate than a subsequent beginning flow rate for deposition. For example, preferably the bypass flow rate is within about 10 percent of a subsequent beginning silane gas flow rate for deposition. It will further be appreciated that the silane gas flow rate or the $N_2$ gas flow rate may be increased or decreased over the course of the CVD silicon nitride film deposition. In addition, optionally a portion of the $N_2$ flow, for example from a second $N_2$ gas source, is also supplied in bypass flow at a flow rate where in a subsequent PECVD deposition the $N_2$ bypass flow is switched to flow into the plasma reactor chamber to make up a total $N_2$ deposition flow rate including for example, an $N_2$ flow rate from a first $N_2$ source and a second $N_2$ source. For example, the second $N_2$ gas source and the silane gas source may be independently supplied, for example from gas sources 20A and 20B as shown in FIG. 1B to form a gas mixture upstream of the plasma reactor chamber 12A. For example, the second $N_2$ gas source and the silane gas source are supplied through respective first MFC's, e.g., 21A and 21B upstream to a common gas feed line e.g., 18C, optionally including a gas mixer e.g., 23, to form a mixture of silane and $N_2$ prior to passing through a second MFC e.g., 21C for controlling the mixture gas flow rate in bypass flow e.g., along gas feed line 18D prior to redirecting the gas flow into the plasma reactor chamber 12A, e.g., through inlet 18B in the PECVD deposition step.

In a fourth step, following the sputter cleaning treatment including $NH_3$, the bypass gas flow including, for example, a $SiH_4/N_2$ mixture or separate $SiH_4$ and $N_2$ gas feeds, are switched (redirected) from bypass gas flow to flow into the plasma reactor chamber through one or more respective gas inlets to begin the PECVD deposition process of silicon nitride. Preferably, the plasma is maintained during the gas flow switching (redirecting) process to include gas flows of $SiH_4$, $N_2$, and $NH_3$. For example, the RF power is increased from a lower level of about 120 Watts to about 175 Watts during the sputter cleaning process to about 350 Watts to about 450 Watts prior to or substantially simultaneously with the gas flow redirecting process to begin the CVD silicon nitride deposition process.

According to the apparatus and method of the present invention, it has been found that formation of copper silicide, e.g., $CuSi_x$ is advantageously avoided. For example, according to prior art methods of depositing silicon nitride by PECVD processes using conventional gas feed systems it has been found that transient gas flows caused by redirecting gas flow sources and altering gas flow rates, for example when transitioning from the sputter clean process to the deposition process, causes the formation of copper silicides over exposed copper features. For example, during a gas flow supply operation to the plasma reactor chamber when transitioning from about zero flow rate to operating gas flow rates, transient gas flow rates or gas flow surges higher than the desired deposition flow rates are produced due to inadequate gas flow rate control response. As a result, unionized reactant gases, for example, silane ($SiH_4$) gas, contacts the copper surface to form an electrically conductive copper silicide. As a result, electrical isolation between conductive lines is compromised leading to undesirable electrical leakage as well as adversely affecting adhesion of the overlying deposited silicon nitride layer to the copper features. The method and bypass gas feed system according to embodiments of the present invention avoids copper silicided formation and additionally has been found to improve CVD film thickness uniformity across a process wafer.

Figure 2:
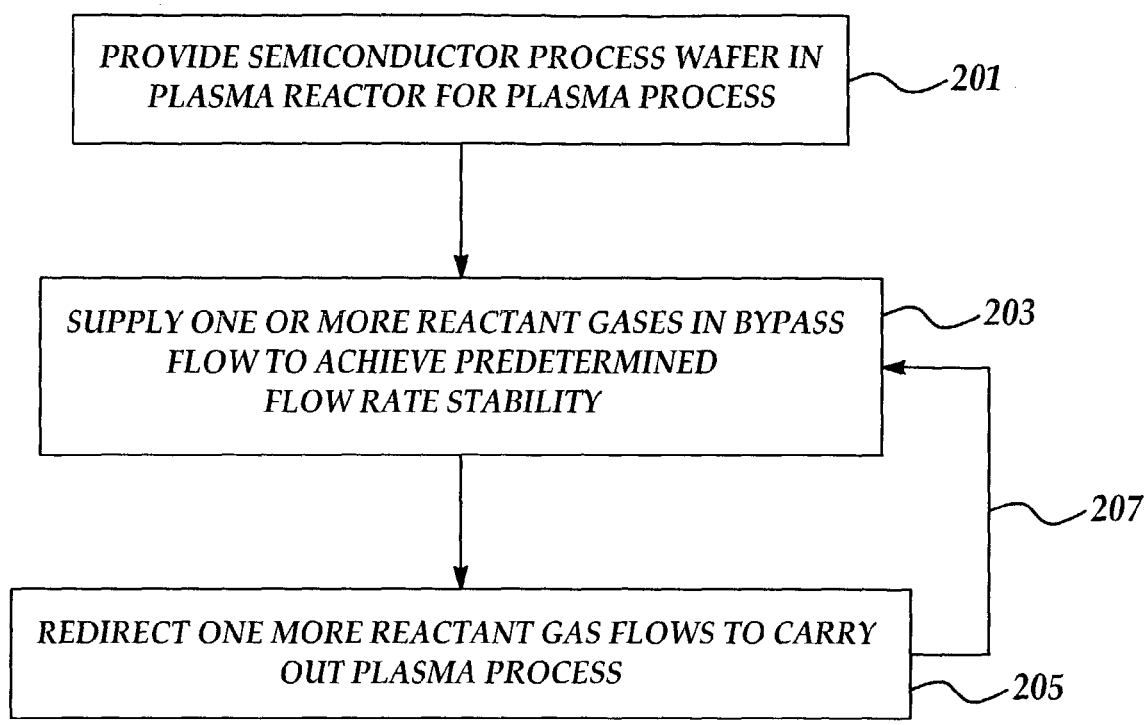
FIG. 2 is a process flow diagram including several embodiments of the method of the present invention.

Referring to FIG. 2 is shown a process flow diagram according to several embodiments of the present invention. In process 201, a process wafer having a process surface is provided in a PECVD reactor having a bypass gas flow system according to preferred embodiments. In process 203, prior to carrying out at least a first plasma process, at least one reactant gas in bypass flow is initiated to achieve a pre-determined gas flow rate stability prior to switching the at least one reactant gas flow into the plasma reactor for carrying out the at least a first plasma process. In process 205, the at least one reactant gas flow is redirected to carry out the at least a first plasma process. As indicated by directional process arrow 207, prior to carrying out a subsequent plasma process in process 205, in process 203, at least one reactant gas in bypass flow is initiated to achieve a pre-determined gas flow rate stability prior to redirecting the at least one reactant gas flow into the plasma reactor for carrying out the subsequent plasma process in process 205. It will be appreciated that for carrying out subsequent plasma processes, processes 203 and 205 preferably take place simultaneously to maintain a plasma while avoiding gas transient surges.

According to the present invention, using the bypass gas feed system in an exemplary embodiment of forming a silicon nitride layer over an exposed copper surface, formation of gas flow transient surges are avoided thereby avoiding the formation of undesired byproducts of ionized reactants with the exposed copper surface while improving the PECVD silicon nitride film deposition uniformity.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A bypass gas feed system for improving a plasma enhanced chemical vapor (PECVD) deposition process comprising:
   a plasma reactor chamber for carrying out a PECVD process including an exhaust line; and,
   at least one gas feed line in gaseous communication with at least one gas source and the plasma reactor chamber said at least one gas feed line including at least one gas flow rate control means for controlling a gas source flow rate and at least one gas flow control valve disposed downstream of the at least one gas flow rate control means for redirecting a gas source flow pathway between a bypass gas flow pathway to bypass the plasma reactor chamber and a gas flow pathway into the plasma reactor chamber, wherein a second exhaust line is provided for communicating with the bypass gas flow pathway.

2. The bypass gas feed system of claim 1, wherein the at least one gas flow control valve comprises a first gas flow control valve upstream of the bypass gas flow pathway, a second gas flow control valve communicating with the bypass gas flow pathway, and a third gas flow control valve downstream of the bypass gas flow pathway and upstream of the plasma reactor chamber.

3. The bypass gas feed system of claim 1, wherein the gas flow rate control means and the at least one gas flow control valve are in electrical communication with a controller for automated selective control respectively of a gas flow rate and a gas control valve state.

4. The bypass gas feed system of claim 1, wherein the gas flow rate control means comprises a mass flow controller.

5. The bypass gas feed system of claim 1, wherein the at least one gas feed line is in communication with at least two gas sources each gas source selectively supplied by a first gas flow rate control means for controlling a gas flow disposed upstream of a second gas flow rate control means for controlling a gas flow rate into one of the bypass gas flow pathway and the gas flow pathway into the plasma reactor chamber.

6. The bypass gas feed system of claim 1, wherein the gas flow pathway into the plasma reactor chamber is disposed in at least one of a top portion, a side portion, and a bottom portion of the plasma reactor chamber.

7. The bypass gas feed system of claim 1, wherein the at least one gas flow control valve comprises a three-way gas flow redirecting valve for redirecting at least two gas flow pathways and forming closed state for redirecting the gas source flow pathway.

8. The bypass gas feed system of claim 7, wherein the at least one gas flow control valve further comprises a second gas flow control valve downstream of the three-way gas flow redirecting valve and bypass gas flow pathway for forming one of an open or closed gas flow pathway into the plasma reactor chamber.

9. The bypass gas feed system of claim 1, wherein the bypass gas flow pathway bypasses the plasma reactor chamber to communicate with the exhaust line.

10. The bypass gas feed system of claim 9, wherein the bypass gas flow pathway communicates with the exhaust line between a first pumping means and a second pumping means.

11. A method for carrying out a plasma enhanced chemical vapor deposition (PECVD) process with improved gas flow stability to avoid unionized reactant precursors and thickness non-uniformities comprising the steps of:
    providing a semiconductor process wafer having a process surface within a plasma reactor chamber for carrying out at least one plasma process;
    supplying at least one reactant gas flow at a selected flow rate to bypass the plasma reactor chamber for a period of time to achieve a predetermined flow rate stability; and,
    redirecting the at least one reactant gas flow into the plasma reactor chamber to carry out the at least one plasma process.

12. The method of claim 11, further comprising repeating the step of supplying during the step of redirecting prior to carrying out a subsequent step of redirecting for carrying out a subsequent plasma process.

13. The method of claim 11, wherein a plasma is formed and maintained during the steps of supplying and redirecting.

14. The method of claim 12, wherein the at least one plasma process comprises a first sputter cleaning process and the subsequent plasma process comprises a PECVD process.

15. The method of claim 14, wherein the PECVD process comprises depositing silicon nitride wherein the at least one reactant gas flow comprises silane ($SiH_4$).

16. The method of claim 14, wherein the sputter cleaning process comprises ammonia ($NH_3$) gas.

17. The method of claim 15, wherein the process surface comprises exposed copper containing semiconductor features.

18. The method of claim 11, wherein the step of supplying at least one reactant gas flow at a selected flow rate comprises a flow rate within about 10 percent of a beginning gas flow rate of the plasma process.

19. The method of claim 18, wherein following the step of redirecting the at least one reactant gas flow rate is varied over the course of the plasma process.

* * * * *